US012206150B2

(12) United States Patent
Pettus et al.

(10) Patent No.: US 12,206,150 B2
(45) Date of Patent: *Jan. 21, 2025

(54) PRINTED CIRCUIT BOARD CONFIGURED FOR WAVEGUIDE COUPLING A DIPLEXER MOUNTED A FIRST SURFACE TO A TRANSMITTER AND A RECEIVER WHICH ARE DIRECTLY MOUNTED ON A SECOND SURFACE

(71) Applicant: Vubiq Networks, Inc., Irvine, CA (US)

(72) Inventors: Michael Gregory Pettus, Rancho Santa Margarita, CA (US); Gabriel Corbett, Austin, TX (US)

(73) Assignee: VUBIQ NETWORKS, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/600,218

(22) Filed: Mar. 8, 2024

(65) Prior Publication Data

US 2024/0250398 A1 Jul. 25, 2024

Related U.S. Application Data

(63) Continuation of application No. 17/507,702, filed on Oct. 21, 2021, now Pat. No. 11,936,087.

(Continued)

(51) Int. Cl.
*H01P 1/213* (2006.01)
*H05K 1/02* (2006.01)
(Continued)

(52) U.S. Cl.
CPC ............ *H01P 1/213* (2013.01); *H01P 1/2138* (2013.01); *H05K 1/0243* (2013.01); *H05K 3/303* (2013.01); *H01P 5/107* (2013.01); *H04B 1/40* (2013.01)

(58) Field of Classification Search
CPC .......... H01P 1/2138; H01P 1/213; H04B 1/40
(Continued)

(56) References Cited

U.S. PATENT DOCUMENTS

| 5,754,948 A | 5/1998 | Metze |
| 11,936,087 B2 * | 3/2024 | Pettus et al. .......... H01P 1/2138 |

(Continued)

OTHER PUBLICATIONS

International Search Report and Written Opinion for International Patent Application PCT/US 21/56112 (mailed Jan. 31, 2022).

(Continued)

*Primary Examiner* — Benny T Lee
(74) *Attorney, Agent, or Firm* — Troutman Pepper Hamilton Sanders LLP (Rochester)

(57) ABSTRACT

A surface mount constructed millimeter wave transceiver device and methods of making a surface mount constructed millimeter wave transceiver device are disclosed. The transceiver device includes a printed circuit board having a first waveguide port and a second waveguide port. A diplexer is surface mounted to a first side of the printed circuit board, the diplexer comprising a low frequency waveguide port and a high frequency waveguide port each coupled to an antenna port. A transmitter and a receiver are surface mounted to a second side of the printed circuit board, located opposite the first side of the printed circuit board, wherein the transmitter and the receiver comprise a transmitter waveguide port and a receiver waveguide port, respectively, that are configured to be aligned to the first waveguide port and the second waveguide port of the printed circuit board, respectively.

20 Claims, 17 Drawing Sheets

Related U.S. Application Data

(60) Provisional application No. 63/104,721, filed on Oct. 23, 2020, provisional application No. 63/188,337, filed on May 13, 2021.

(51) Int. Cl.
  *H05K 3/30* (2006.01)
  *H01P 5/107* (2006.01)
  *H04B 1/40* (2015.01)

(58) Field of Classification Search
  USPC .......................................................... 333/134
  See application file for complete search history.

(56) References Cited

U.S. PATENT DOCUMENTS

| | | |
|---|---|---|
| 2001/0054940 A1 | 12/2001 | Ishida |
| 2003/0027530 A1 | 2/2003 | Levitt et al. |
| 2007/0066246 A1 | 3/2007 | McDonald et al. |
| 2013/0183913 A1 | 7/2013 | Tevell et al. |
| 2014/0168518 A1 | 6/2014 | Pescod et al. |
| 2016/0013534 A1 | 1/2016 | Pettus et al. |

OTHER PUBLICATIONS

International Search Report for International Patent Application PCT/US 21/56113 (conducted Dec. 26, 2021).

* cited by examiner

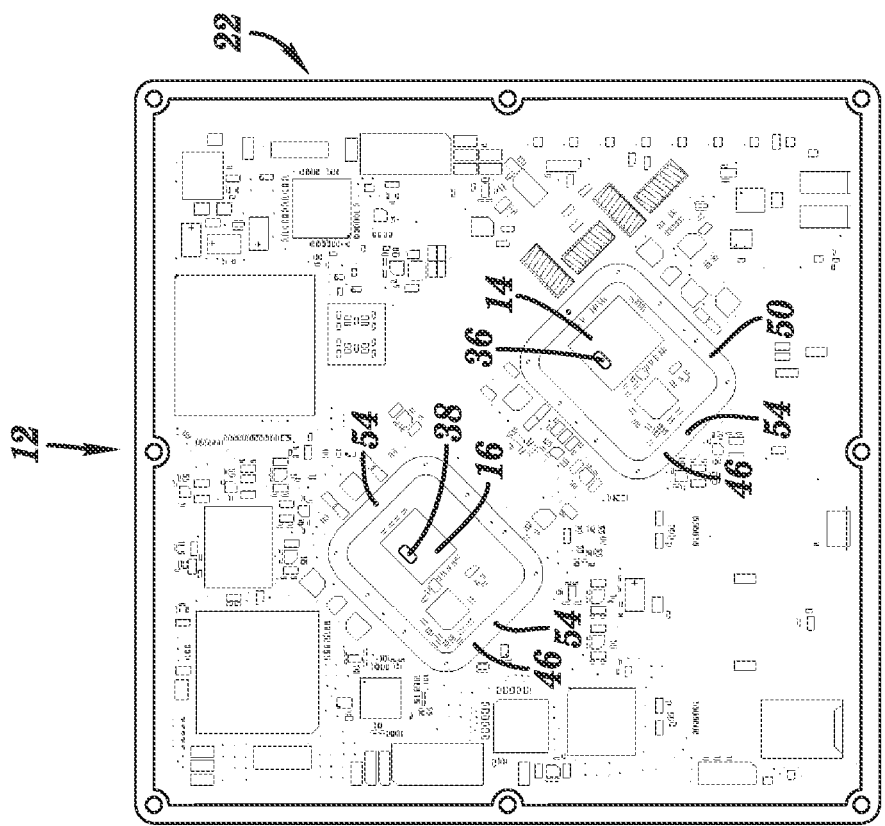
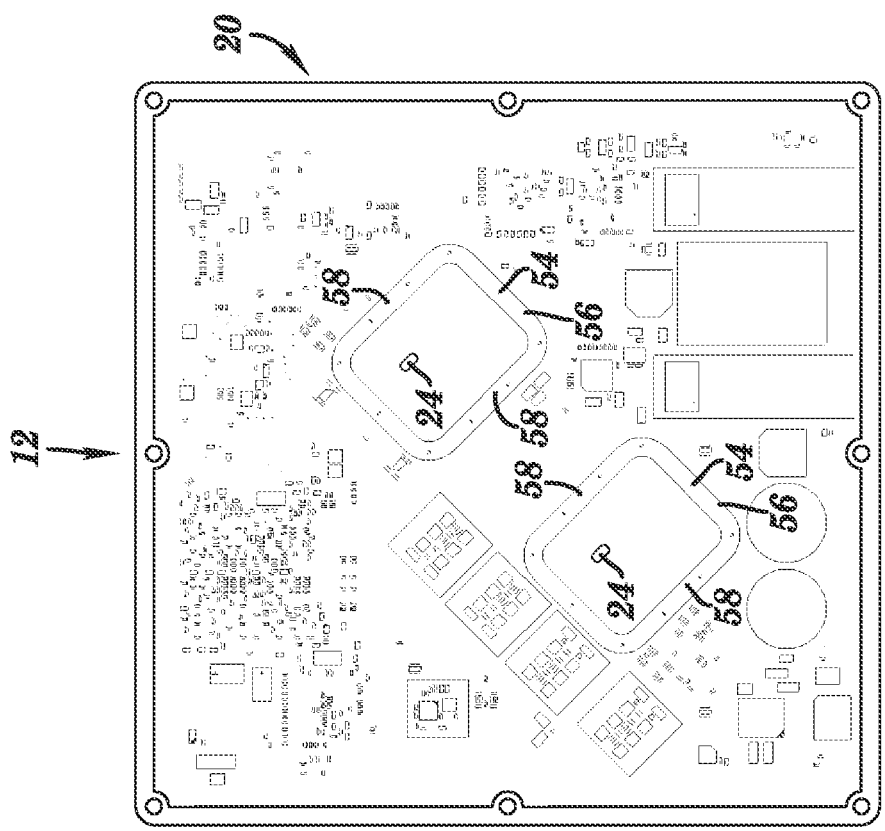
FIG. 7B
FIG. 7A

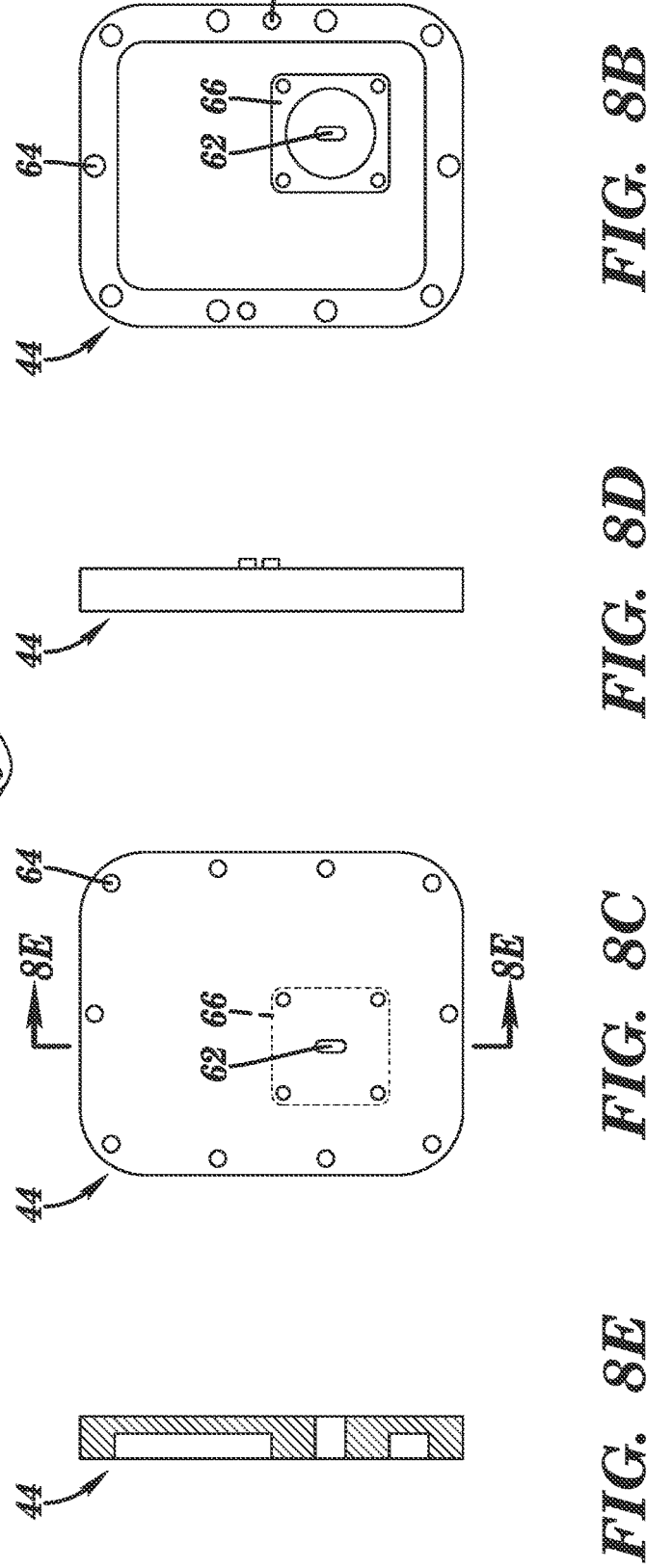

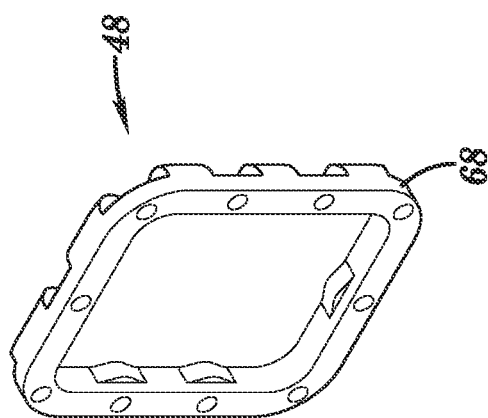
FIG. 9A
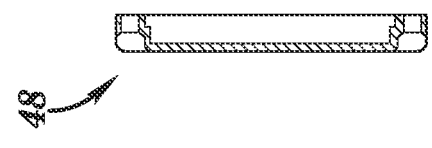
FIG. 9E
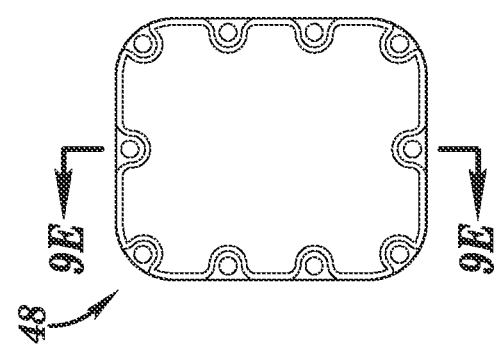
FIG. 9D
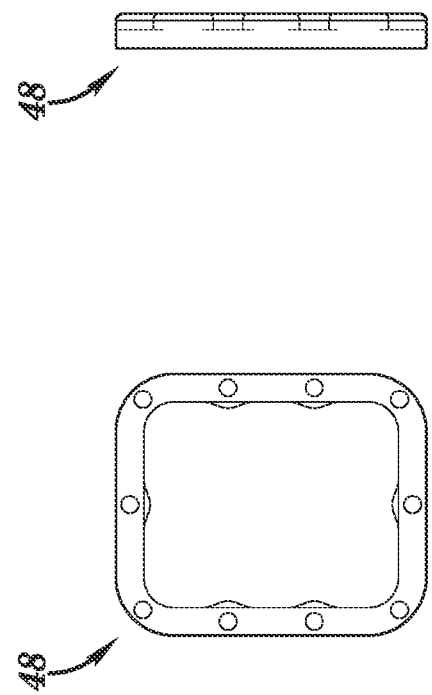
FIG. 9C
FIG. 9B

PRINTED CIRCUIT BOARD CONFIGURED FOR WAVEGUIDE COUPLING A DIPLEXER MOUNTED A FIRST SURFACE TO A TRANSMITTER AND A RECEIVER WHICH ARE DIRECTLY MOUNTED ON A SECOND SURFACE

CROSS-REFERENCES TO RELATED APPLICATIONS

This application is a continuation of U.S. patent application Ser. No. 17/507,702, filed Oct. 21, 2021, which issued as U.S. Pat. No. 11,936,087 on Mar. 19, 2024, and claims the benefit of Provisional Patent Application Ser. No. 63/104,721, filed Oct. 23, 2020, and Provisional Patent Application Ser. No. 63/188,337, filed May 13, 2021, which are hereby incorporated by reference in their entirety.

FIELD

This technology relates to a surface mount constructed millimeter wave transceiver device and methods thereof.

BACKGROUND

The use of millimeter wave (mmWave) frequencies for high speed data transport continues to grow. The mmWave spectrum is defined from approximately 30 GHz to 300 GHz, with this frequency range designated as extremely high frequency (EHF). A communication system designed for the EHF range can take advantage of the fact that the physical amount of spectrum available at a particular operating frequency exhibits naturally wide bandwidth. Typical examples of operating channel bandwidths are between 1 and 2 GHz in the 60 to 90 GHz operating frequencies. Future telecommunication systems are targeting new semiconductor technologies that will operate above 100 GHz, with the potential for even wider channel bandwidths.

One of the key technologies that has been rapidly evolving is how a mmWave semiconductors are packaged for implementation in high speed communications systems. Initially, only the bare die from a semiconductor fabrication wafer was available. A bare die requires careful placement and some form of wire bonding for interconnection between the die and other circuitry needed to create a complete transmitter and receiver. Newer mmWave packaging methods, such as wafer level ball grid array (WLBGA), and wafer level chip scale packaging (WLCSP), allowed the creation of efficient, low loss packages that enabled much simplified manufacturing techniques. These types of packages were implemented as surface-mount devices (SMD) and became part of the vast multitude of components in the surface-mount technology (SMT) domain. What this meant was much lower manufacturing costs, higher manufacturing yields, and predictable mmWave performance.

As the frequency of mmWave operation continues to move upwards in the electromagnetic spectrum, electrical conductors, such as wire bonds or even SMT package electrical pins that interface to electrical PCB traces, constrains the ultimate performance and efficiency due to electrical losses. These electrical losses are characterized in the areas of electrical resistance, inductance, and capacitance. The industry has recognized this limitation and has introduced mmWave semiconductor packages that transduce the electrical energy into electromagnetic waves, carried via a waveguide port, within the package itself. By constructing the package such that the waveguide port is at the same planar surface as the other input and output (I/O) pins on the package, it is now possible to place the package as an SMD directly on to a printed circuit board (PCB) with the possibility of transferring the mmWave energy without any electrical conductors. One example of this kind of new direct waveguide package is the land grid array cavity (LG_CAV) type used in newer mmWave up converter devices (for use as a transmitter) and down converter devices (for use as a receiver).

High speed, low latency mmWave wireless transport systems make use of the ability to transmit and receive simultaneously, known as frequency division duplex (FDD), which result in high throughput data rates with low latency delay in data delivery. The use of a frequency filter diplexer allows the ability for FDD operation by isolating the transmitter energy from desensitizing the local receiver while coupling both the transmitter and the receiver to a common antenna. Typically, mmWave diplexers are designed as waveguide devices to exhibit low energy loss and high transmitter to receiver isolation. The traditional method used to couple the transmitter and receiver to the diplexer was through the use of standard waveguide flange type mechanical interfaces. These allowed low loss and good electrical connectivity, but at the cost and larger size of using separate waveguide flanges for the transmitter and receiver connections.

FIG. 1 shows a prior art system and method for coupling mmWave or microwave electromagnetic energy from transmitter and receiver modules, 210 and 208, respectively, to a diplexer 212. The final assembly, mounted in enclosure 102, forms a full duplex transceiver terminal used as part of a full duplex link for mmWave or microwave wireless digital transport. The use of separate mechanical transmitter and receiver modules with waveguide flanges must be assembled to the final mechanical assembly and then interconnected to the single printed circuit board (PCB) 206 and diplexer 212. The transmitter module, receiver module, and PCB are all manufactured separately. The transmitter and receiver modules also require extra manufacturing steps for mechanically mounting to the enclosure, mechanical coupling to the diplexer waveguide flanges, and electrically interconnecting to the PCB. The separate waveguide module construction for the transmitter and receiver, and the added steps in the final assembly increase the overall manufacturing costs due to the costs of the separate assemblies. The separate assembly procedures for the transmitter module, receiver module, diplexer, and PCB also significantly increase the total manufacturing assembly time.

SUMMARY OF THE INVENTION

One aspect of the present technology relates to a surface mount constructed millimeter wave transceiver device. The transceiver device includes a printed circuit board having a first waveguide port and a second waveguide port. A diplexer is surface mounted to a first side of the printed circuit board, the diplexer comprising a low frequency waveguide port and a high frequency waveguide port each coupled to an antenna port. A transmitter and a receiver are surface mounted to a second side of the printed circuit board, located opposite the first side of the printed circuit board, wherein the transmitter and the receiver comprise a transmitter waveguide port and a receiver waveguide port, respectively, that are configured to be aligned to the first waveguide port and the second waveguide port of the printed circuit board, respectively.

Another aspect of the present technology relates to a method of making a millimeter wave transceiver device. The method includes providing a printed circuit board having a first waveguide port and a second waveguide port. A diplexer is surface mounted to a first side of the printed circuit board, the diplexer comprising a low frequency waveguide port and a high frequency waveguide port, each of the low frequency waveguide port and the high frequency waveguide port coupled to an antenna port. A transmitter and a receiver are surface mounted to a second side of the printed circuit board, located opposite the first side of the printed circuit board, wherein the transmitter and the receiver comprise a transmitter waveguide port and a receiver waveguide port, respectively, aligned to the first waveguide port and the second waveguide port of the printed circuit board, respectively, when the transmitter and the receiver are surface mounted.

This technology provides a number of advantages including providing surface mount constructed millimeter wave transceiver devices and methods of making the same that rely entirely on surface mounting of the waveguide components. This provides a transceiver device that is easy to manufacture, allows for efficient transfer of electromagnetic energy, and efficient coupling between the packages and a diplexer without the need for separate waveguide flanges. Further, the diplexer can be surface mounted in either a high transmit or low transmit configuration without the need for changing the part or the fabrication technique.

BRIEF DESCRIPTION OF THE DRAWINGS

FIGS. 7A and 7B illustrate first and second sides of an exemplary host PCB with mounting locations and waveguide port details and screw hole details for mounting SMT waveguide adaptors and RF shields thereon.

FIGS. 8A-8E illustrate perspective, top, bottom, side, and cross-sectional view, respectively, of an exemplary SMT waveguide adaptor that may be employed for an exemplary surface mount constructed millimeter wave integrated transceiver device.

FIG. 9A-9E illustrate perspective, top, cross-sectional, bottom, and side views, respectively, of an exemplary RF shield that may be employed in the exemplary surface mount constructed millimeter wave integrated transceiver device.

DETAILED DESCRIPTION OF THE INVENTION

Figure 1:
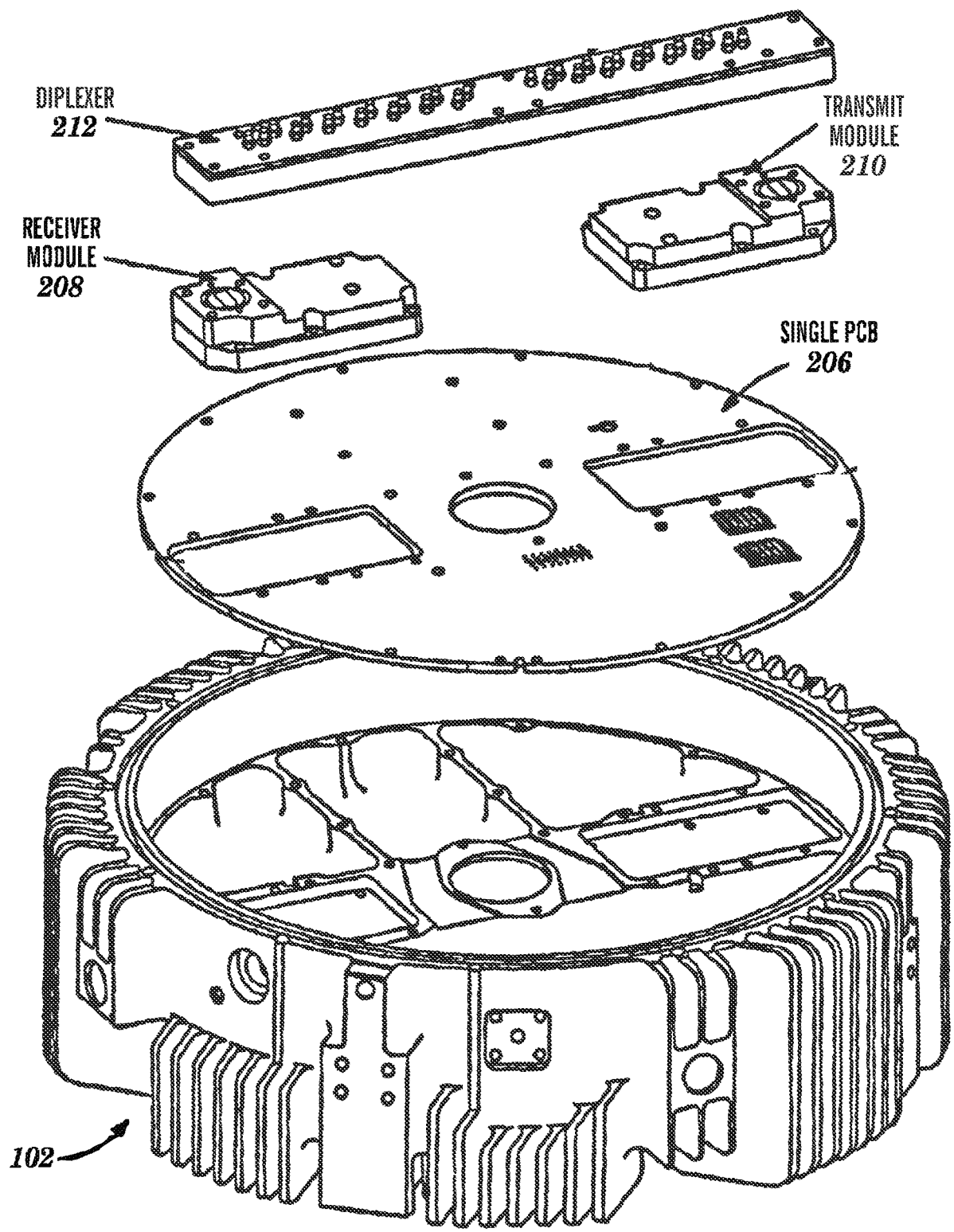
FIG. 1 is an exploded view of a prior art example of a waveguide coupling with waveguide flanges.
Figure 2A:
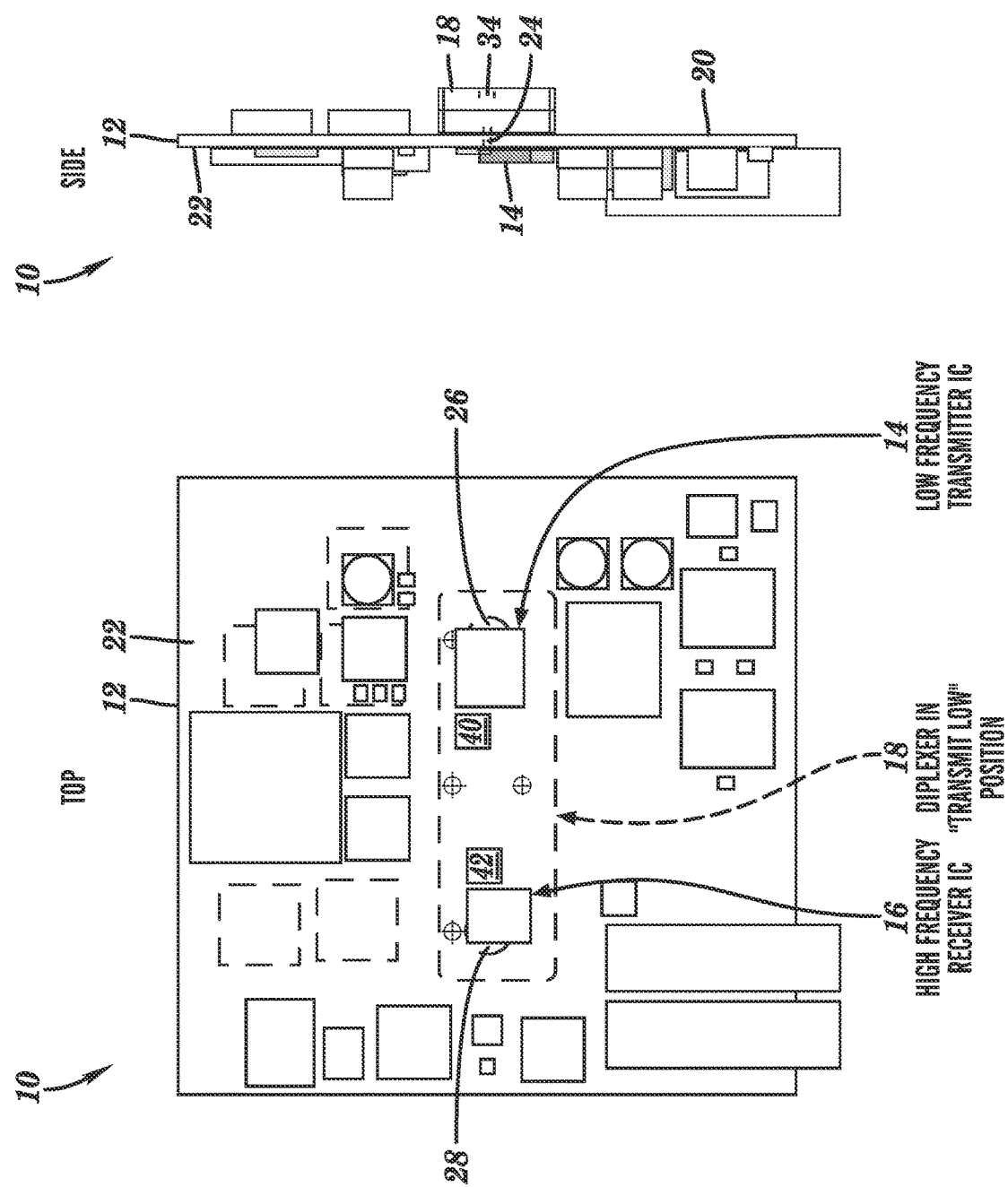
FIG. 2A illustrates top and side views of an exemplary surface mount constructed millimeter wave integrated transceiver device in a transmit low configuration.
Figure 2B:
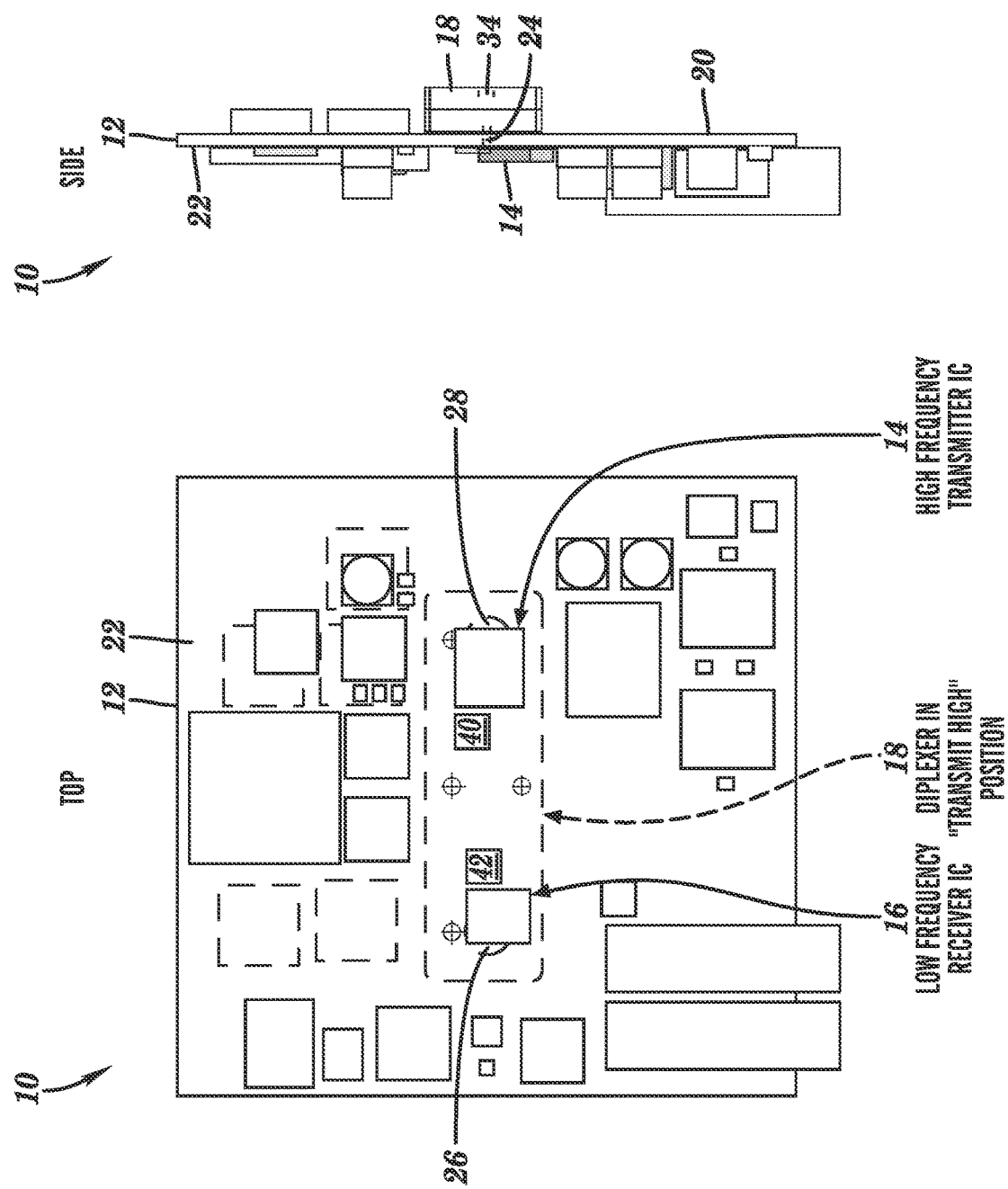
FIG. 2B illustrates top and side views of the exemplary surface mount constructed millimeter wave integrated transceiver device in a transmit high configuration.

An exemplary surface mount constructed millimeter wave transceiver device 10 is illustrated in FIGS. 2A and 2B. The transceiver device 10 includes a printed circuit board (PCB) 12 that supports waveguide transmitter package 14, waveguide receiver package 16, and a diplexer 18, the elements of which are surface mounted on the PCB 12. Surface mounting techniques are known in the art. The PCB 12 may also support a number of additional elements for operation of the transceiver device 10 including, by way of example only, a modem, one or more processors, one or more memory devices, and one or more communication interfaces, although the PCB 12 may also include other types and/or numbers of elements in other configurations for operation of the transceiver device 10.

Referring again FIGS. 2A and 2B, in this example, the diplexer 18 is surface mounted to a first side 20 of the PCB 12. The diplexer 18 includes a common antenna port 34. The waveguide transmitter package 14 and the waveguide receiver package 16 are surface mounted to a second side 22 of the PCB 12, located opposite the first side 20 of the PCB 12, although the PCB 12 may include other types and/or numbers of elements in other configurations, including transmitter and receiver local oscillators, by way of example only. The surface mount constructed millimeter wave transceiver device 10 of this technology advantageously provides an entirely surface mounted PCB assembly that is easy to manufacture. More specifically, the surface mount constructed millimeter wave transceiver device 10 allows for implementing waveguide mmWave packages directly onto a PCB that allows efficient transfer of electromagnetic energy. This technology allows the mmWave electromagnetic energy to efficiently couple between the packages and a diplexer without the need for separate waveguide flanges. The waveguide transmitter package 14 can be either a low frequency transmitter IC (FIG. 2A) or a high frequency transmitter IC (FIG. 2B). The waveguide receiver package 16 can be either a high frequency receiver IC (FIG. 2A) or a low frequency receiver IC (FIG. 2B). Further, the diplexer 18 can be surface mounted in either a high transmit (diplexer in "transmit high" position as shown FIG. 2B) or low transmit (diplexer in "transmit low" position as shown in FIG. 2A) configuration without the need for changing the part or the fabrication technique, as described in further detail below. As shown in FIGS. 2A and 2B, the diplexer 18 includes a low frequency waveguide port 26 and a high frequency waveguide port 28.

Figure 3A:
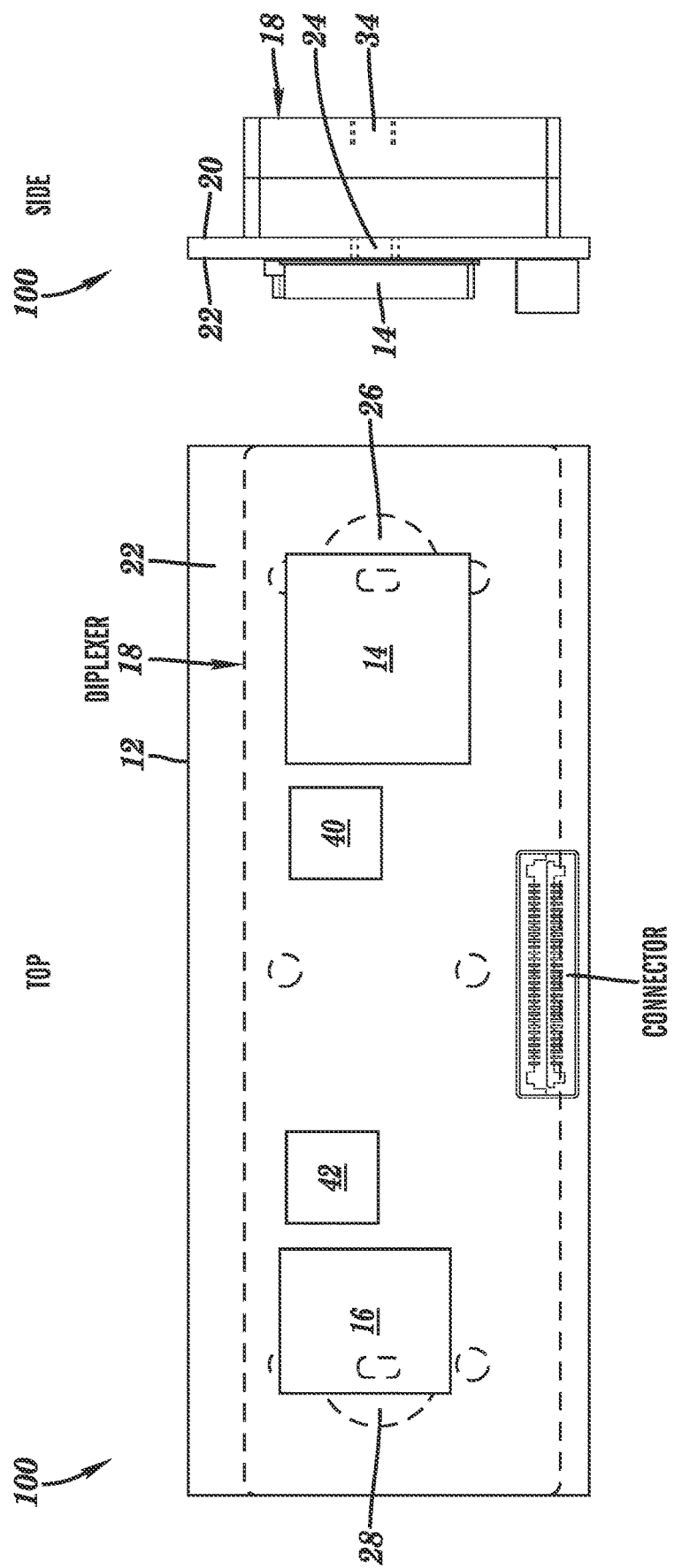
FIG. 3A illustrates top and side views of the millimeter wave transceiver module of the surface mount constructed millimeter wave integrated transceiver device in the transmit low configuration shown in FIG. 2A.
Figure 3B:
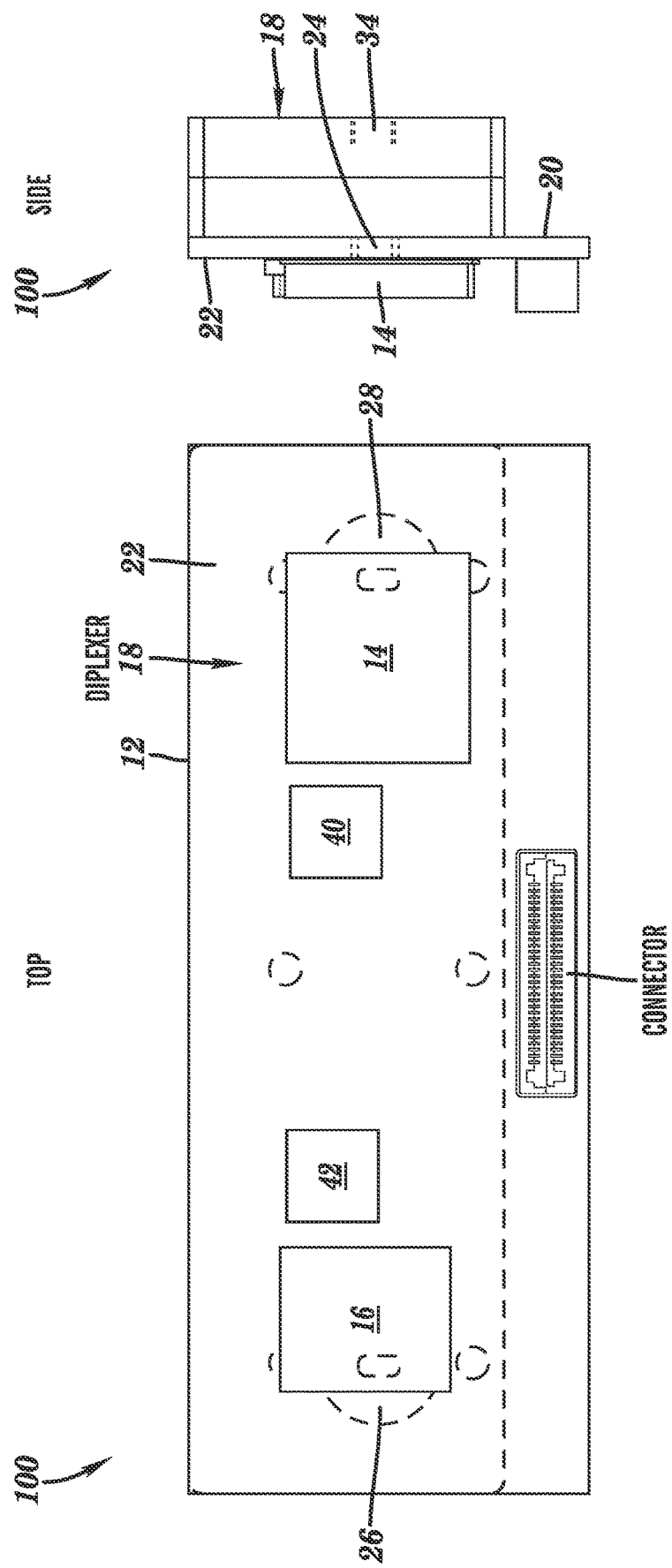
FIG. 3B illustrates top and side views of the millimeter wave transceiver module of the surface mount constructed millimeter wave integrated transceiver device in the transmit high configuration shown in FIG. 2B.

In this example, transceiver device 10 is a fully integrated transceiver device, although in other examples, such a transceiver device 100 may be formed as a plug-in module as shown in FIGS. 3A and 3B with the same elements as described with respect to transceiver device 10. FIGS. 2A and 2B show examples of the fully integrated transceiver device 10 configured for transmit (TX) Low and transmit (TX) High (as described below), respectively, with similar relationships of the waveguide transmitter package 14 and the waveguide receiver package 16 to the PCB 12 and the diplexer 18 compared with the transceiver device 100, which is formed as a plug-in module, shown in FIGS. 3A and 3B. The layout of PCB 12 and fabrication are identical for the TX Low and TX high integrated transceiver for both transceiver device 10 and transceiver device 100. The same reduced manufacturing complexity applies to the integrated transceiver design since the PCB fabrication is the same for both configurations.

As shown in FIGS. 2A, 2B, 3A, and 3B, the PCB 12 includes internal waveguide ports 24 that extend through the PCB 12 and allow for connection between waveguide transmitter package 14 and waveguide receiver package 16 and the diplexer 18 as described below. As shown in FIGS. 3A and 3B, the transceiver 100, which is a plug-in module, also includes a connector.

Figure 4A:
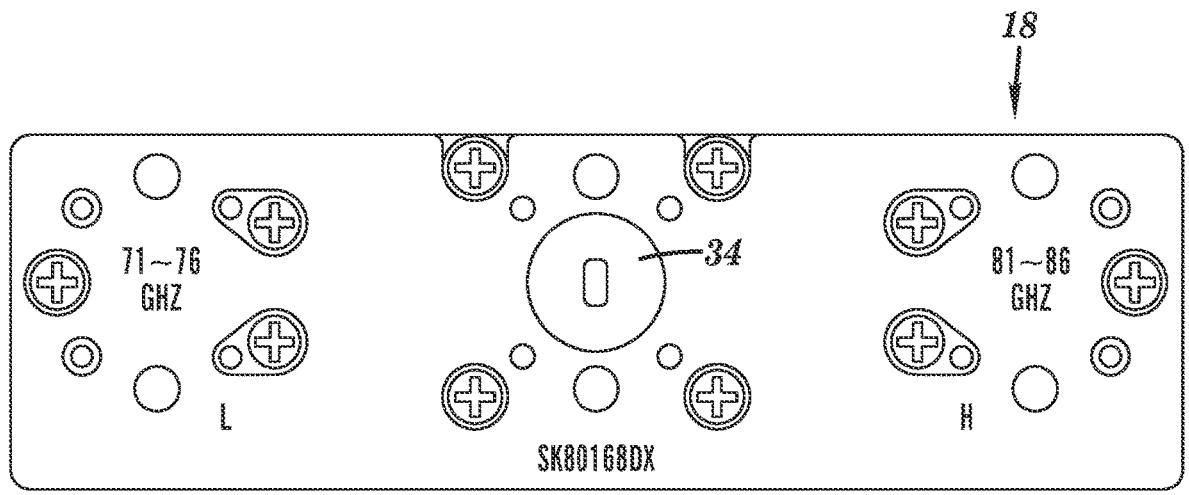
FIGS. 4A and 4B illustrate top and bottom views of the millimeter wave diplexer of the millimeter wave transceiver module shown in FIGS. 3A and 3B.
Figure 4B:
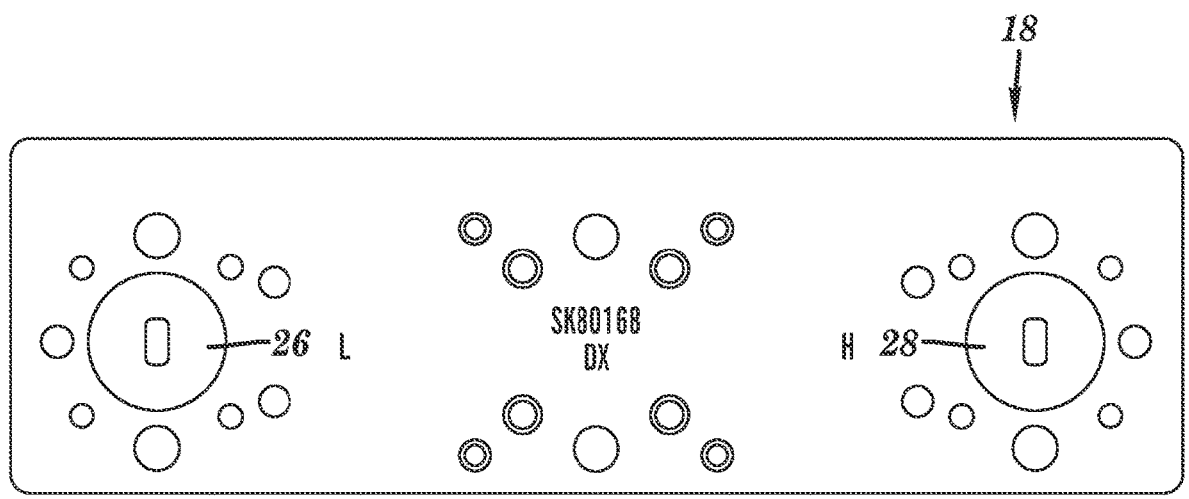

FIGS. 4A and 4B illustrate top and bottom views, respectively, of an exemplary diplexer that may be utilized for the diplexer 18 in either transceiver device 10 (FIGS. 2A and 2B) or transceiver device 100 (FIGS. 3A and 3B). In one example, the diplexer 18 is Universal Microwave Technology part number SK80168DX diplexer, although other diplexers may be employed. In this example, the diplexer 18 is designed for the low ("L") and high ("H") mmWave frequency bands, although other frequency bands may be utilized. In this example, the 71 GHz to 76 GHz band is identified as the "Low" ("L") frequency, and the 81 GHz to 86 GHz band as the "High" ("H") frequency (as shown in FIG. 4A). The diplexer 18 includes a low frequency waveguide port 26 (FIG. 4B) and a high frequency waveguide port 28 (FIG. 4B) that are coupled through low and high frequency internal filters (not shown), respectively, to a common antenna port 34 (FIG. 4A) on the other side of the diplexer 18. In one example, the diplexer 18 allows reception of high frequency electromagnetic energy and simultaneous transmission of low frequency electromagnetic energy coupled to a common antenna enabling frequency division duplexing (FDD) operation. In this example, a transceiver configured in this way is known in the industry as the "TX Low" side of a full duplex link. In another example, the diplexer 18 allows reception of low frequency electromagnetic energy and simultaneous transmission of high frequency electromagnetic energy which produces the "TX High" side of a full duplex link.

FIGS. 5A-5D illustrate an exemplary millimeter waveguide transmitter package 14 (FIGS. 5A-5C) that may be employed in either transceiver device 10 (FIGS. 2A and 2B) or transceiver device 100 (FIGS. 3A and 3B). The waveguide transmitter package 14 in this example is part number ADMV7310 from Analog Devices, Inc., which uses the land grid array cavity (LGA_CAV) package with an integrated waveguide port 36 (FIGS. 5A and 5D), although other transmitter IC packages that may be surface mounted may be employed. The waveguide port 36 (shown in more detail in FIG. 5D) is planar to the other input/output and power pins 37 (FIG. 5A) around the periphery of the package, allowing the package to be surface mounted, including the waveguide port 36, directly to the PCB 12 as shown in FIGS. 2A, 2B, 3A and 3B and described in further detail below.

FIGS. 6A-6D illustrates an exemplary millimeter waveguide receiver package 16 that may be employed in either transceiver device 10 (FIGS. 2A and 2B) or transceiver device 100 (FIGS. 3A and 3B). The waveguide receiver package 16 (FIGS. 6A-6C) in this example is part number ADMV7410 from Analog Devices, Inc., which uses the land grid array cavity (LGA_CAV) package with an integrated waveguide port 38 (FIGS. 6A and 6D), although other receiver IC packages that may be surface mounted may be employed. The waveguide port 38 (shown in more detail in FIG. 6D) is planar to the other input/output and power pins 39 (FIG. 6A) around the periphery of the package, allowing the package to be surface mounted, including the waveguide port, directly to the PCB 12 as shown in FIGS. 2A, 2B, 3A and 3B and described in further detail below.

Figure 5A:
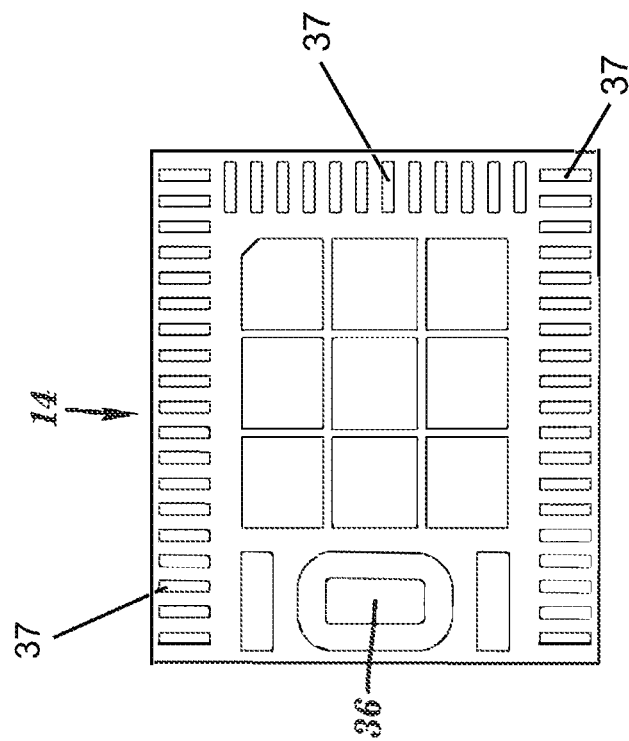
FIGS. 5A-5C are bottom, top, and side views, respectively, of an exemplary millimeter wave transmitter waveguide package that may be employed in the millimeter transceiver module as shown in FIGS. 3A and 3B.
Figure 5D:
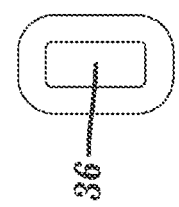
FIG. 5D is a more detailed view of the transmitter waveguide port shown in FIG. 5A.
Figure 5B:
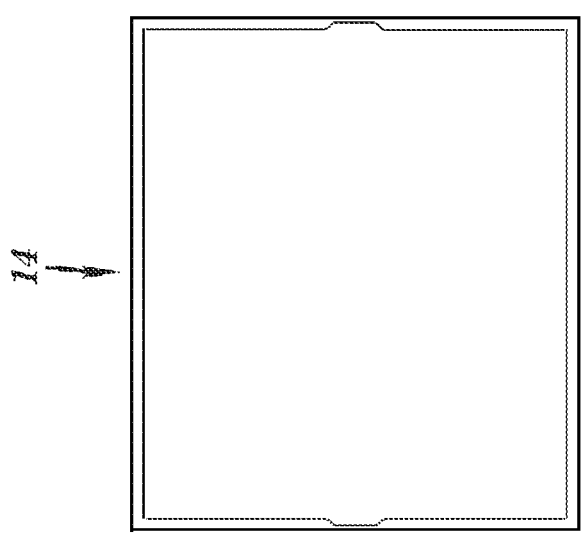
Figure 5C:
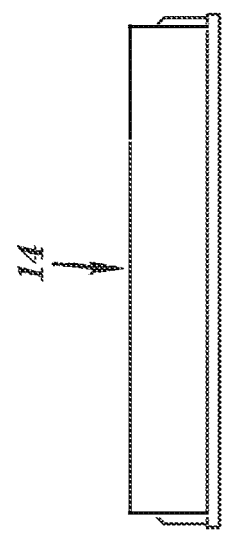
Figure 6A:
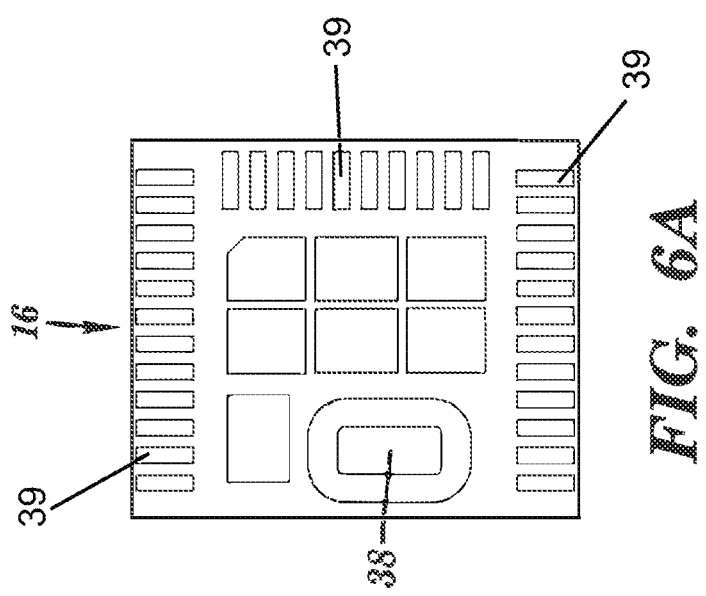
FIGS. 6A-6C are bottom, top, and side views, respectively, of an exemplary millimeter wave receiver waveguide package that may employed in the millimeter transceiver module as shown in FIGS. 3A and 3B.
Figure 6D:
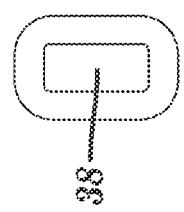
FIG. 6D is a more detailed view of the receiver waveguide port shown in FIG. 6A.
Figure 6B:
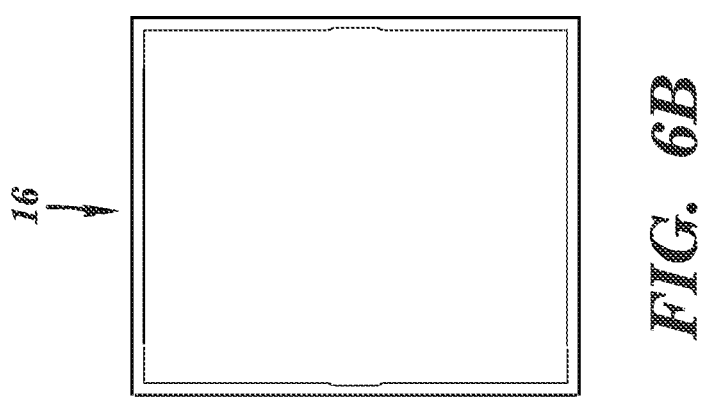
Figure 6C:
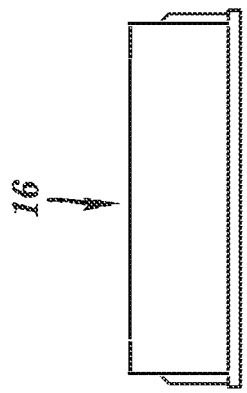

Referring now more specifically to FIG. 3A, transceiver device 100 is a mmWave all surface mount transceiver designed as a plug-in module and assembled for a TX Low configuration. The transceiver device 100 includes the exemplary waveguide transmitter package 14 and the waveguide receiver package 16 as shown in FIGS. 5A-5C and 6A-6C, respectively, and the diplexer 18 as shown in FIGS. 4A and 4B. In this example, the waveguide transmitter package 14 is a low frequency transmitter IC that operates in a range from about 71 GHz to about 76 GHz, as shown for example in FIG. 4A. Waveguide transmitter package 14 is surface mounted to the second side 22 of the PCB 12 and is accurately positioned such that the waveguide port 36 (as shown in FIGS. 5A and 5D) is aligned with one of the waveguide ports 24 formed in the PCB 12 at the right side as shown in FIG. 3A. The diplexer 18 is affixed to the first side 20 of the PCB 12 with alignment of its high and low waveguide ports 26 and 28 to the respective waveguide ports 24 in the PCB 12 as shown in FIG. 3A. Waveguide receiver package 16 is a high frequency receiver IC that operates in a range from about 81 GHz to about 86 GHz, as shown for example in FIG. 4A. Waveguide receiver package 16 is surface mounted to the second side 22 of the PCB 12 assembly positioned such that the waveguide port 38 (as shown in FIGS. 6A and 6D) is aligned with one of the waveguide ports 24 in the PCB 12 at the left side as shown in FIG. 3A. In this configuration, the diplexer 18 is positioned with its low frequency waveguide port 26 at the right side of the PCB 12 and its high frequency waveguide port 28 at the left side of the PCB 12 as shown in FIG. 3A. The diplexer 18 includes a common antenna port 34.

FIG. 3B illustrates the all surface mount transceiver device 100 designed as a plug-in module and assembled for a TX High configuration. The transceiver device 100 includes the exemplary waveguide transmitter package 14 and the waveguide receiver package 16 as shown in FIGS. 5A-5C and 6A-6C, respectively, and the diplexer 18 as shown in FIGS. 4A and 4B. In this example, the waveguide transmitter package 14 is a high frequency transmitter IC (as shown for example in FIG. 2B) that operates in a range from about 81 GHz to about 86 GHz. The waveguide transmitter package 14 is surface mounted to the second side 22 of the PCB 12 assembly accurately positioned such that the waveguide port 36 (as shown in FIGS. 5A and 5D) is aligned with one of the waveguide ports 24 formed in the PCB 12 at the right side as shown in FIG. 3B. The diplexer 18 is affixed to the first side 20 of the PCB 12 with alignment of its low and high waveguide ports 26 and 28 to the respective waveguide ports 24 in the PCB 12. The waveguide receiver package 16 in this example is a low frequency receiver IC as shown for example in FIG. 2B) that operates in a range of about 71 GHz to about 76 GHz. The waveguide receiver package 16 is surface mounted to the second side 22 of the PCB 12 assembly positioned such that the waveguide port 38 (as shown in FIGS. 6A and 6D) is aligned with one of the waveguide ports 24 in the PCB 12 at the left side as shown in FIG. 3B. In this configuration, the diplexer 18 is positioned with the high frequency waveguide port 28 at the right side of the PCB 12 and the low frequency waveguide port 26 at the left side of the PCB 12 as shown in FIG. 3B. The diplexer 18 includes a common antenna port 34.

The layout on PCB 12 shown in FIGS. 3A and 3B includes internal waveguide ports 24 positioned relative to the low and high frequency diplexer ports 26 and 28, and to the IC package layout footprints for the periphery I/O pins. The receiver local oscillator IC 42 and the transmitter local oscillator IC 40, as shown in FIGS. 2A, 2B, 3A, and 3B, are programmable in terms of their respective operating frequencies, which determine the operating frequencies (either High or Low) of the waveguide transmitter package 14 and the waveguide receiver package 16. However, the waveguide transmitter package 14 and the waveguide receiver package 16 are specifically built, with unique part numbers, for all of the combinations of TX High and TX Low, meaning there is a unique waveguide receiver package 14 for low frequency (i.e., 71 GHz to 76 GHz) and a unique waveguide receiver package 14 for high frequency (i.e., 81 GHz to 86 GHz). Also, there is a unique waveguide transmitter package 16 for low frequency and a unique waveguide transmitter package 16 for high frequency. The layout accommodates the diplexer 18 to be mounted in either the TX Low/RX High position, or effectively rotated 180 degrees creating the opposite TX High/RX Low position. Therefore, the only assembly changes required to change the transceiver device 100 from a TX Low (FIG. 3A) configuration to a TX High (FIG. 3B) configuration are the mounting of the correct SMT waveguide transmitter package 14 and the waveguide receiver package 16, and the orientation of the diplexer 18. As such, the PCB 12 itself is identical in layout and fabrication allowing the same PCB fabrication to be used in either configuration. By having the same PCB 12 layout available for either the TX High (FIG. 3B) or TX Low (FIG. 3A) assembled configurations, the manufacturing complexity and cost is reduced. There may be other waveguide transmitter package 14 and waveguide receiver package 16 used that can cover the full range of about 71 GHz to about 86 GHz that may also be applied to the common PCB 12 layout. Such devices can be used for either a transmit high or transmit low by providing the correct local oscillator frequency for either case using the programmable receiver local oscillator IC 40 and the transmitter local oscillator IC 42.

Referring now to FIGS. 7A, 7B, 8A-8E, 9A-9E, 10A-10F, 11A-11C, 12, 13A, and 13B, in additional examples, the surface mount mmWave transceiver devices 10 or 100 may include additional components for implementing a pair of surface mount (SMT) waveguide adaptors 44 (FIGS. 8A-8E) on the first side 20 of the PCB to allow surface mounting of the diplexer 18. The purpose of the SMT waveguide adaptors 44 is to extend the electrical waveguide interfaces from the waveguide transmitter package 14 and the waveguide receiver package 16, which are system-in-package (SiP) devices, that are surface mounted to the second side 22 of the host PCB 12.

Figure 10C:
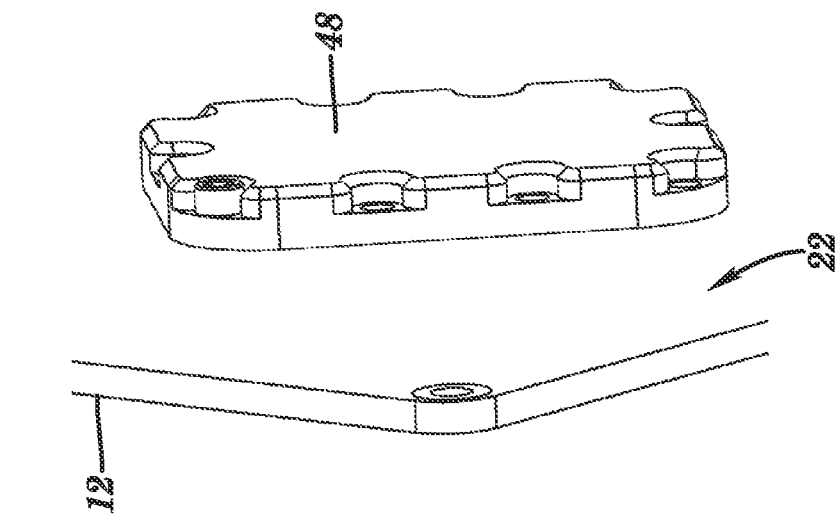
FIGS. 10A-10F illustrate the mounting of an exemplary SMT waveguide adaptor and RF shield to a PCB board as well as the mounting relationships between the SMT waveguide adaptor and the RF shield including threaded holes and alignment pin details.
Figure 10B:
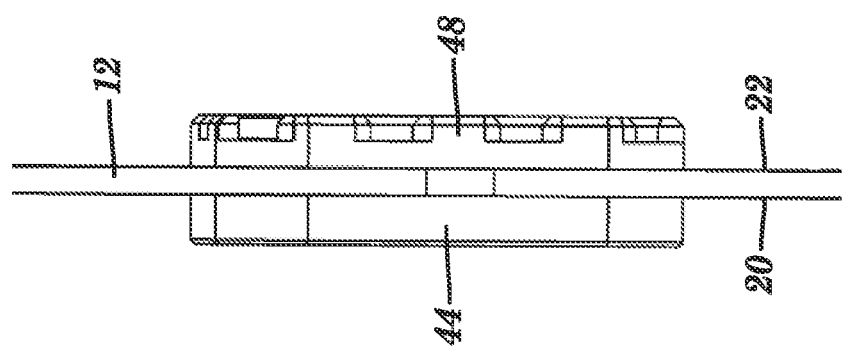

Referring now more specifically to FIGS. 7A and 7B, in this example, the second side 22 of the PCB 12 includes mounting areas 46 for RF shields 48 (as shown in FIGS. 9A-9E) for both the SiP waveguide transmitter package 14 having waveguide port 36 and the SiP waveguide receiver package 16 having waveguide port 38 (as shown in FIG. 7B) when located on the second side 22 (FIG. 7B) of the host PCB 12, as shown in FIG. 7B, for example. Referring again to FIG. 7B, the mounting areas 46 for the RF shields 48 include alignment pin holes 50 to receive alignment pins 52 (also shown in FIG. 10D) located on the SMT waveguide adaptors 44 (as shown in FIGS. 8A and 8B, and 10D), as well as through holes 54 for connecting the RF shields 48 to the SMT waveguide adaptors 44 as described in further detail below. Referring now to FIG. 7A, the first side 20 of the PCB 12 includes mounting areas 56 for the SMT waveguide adaptors 44 (FIGS. 8A-8E). The mounting areas 56 for the SMT waveguide adaptors 44 include alignment pin holes 58 to receive the alignment pins 52 located on the SMT waveguide adaptors 44 (as shown in FIGS. 8A and 8B), as well as the through holes 54 for connecting the RF shields 48 to the SMT waveguide adaptors 44 as described in further detail below.

The host PCB 12 further includes waveguide ports 24, as described above, for both the SiP waveguide transmitter package 14 and the waveguide receiver package 16 and the diplexer 18 (FIG. 4A and 4B). In this example, the waveguide ports 24 extend through the host PCB 12 and are internally plated to form a waveguide electrical connection between the SiP waveguide transmitter package 14 and the waveguide receiver package 16 through the PCB 12 and out to the first side 20 of the host PCB 12 for connection of the SMT waveguide adaptors 44. The first side 20 of the host PCB 12 electrically extends the internal plated wall of the waveguide ports 24 to the first side 20, which is plated in the mounting areas 56 for the SMT waveguide adaptors 44.

Referring now to FIGS. 8A-8E, schematics for an exemplary SMT waveguide adaptor 44 are illustrated. FIG. 8E is a cross-sectional view of FIG. 8C along the direction marked 8E in FIG. 8C. In one example, the SMT waveguide adaptors 44 are constructed of aluminum with a silver plating, although other electrically conductive materials may be employed. The SMT waveguide adaptors 44 are surface mounted to the surface of the first side 20 of the PCB 12 in the SMT waveguide mounting areas 56 as shown in FIG. 7A, during the SMT reflow process, as described below. The SMT waveguide adaptors 44 include waveguide openings 62, as shown in FIGS. 8A-8C, 10A, 10D, and 11A. The SMT waveguide adaptors 44 are mounted on the first side 20 of the host PCB 12 such that the waveguide openings 62 in the SMT waveguide adaptors 44 are aligned with the waveguide ports 24 in the host PCB 12, as shown in FIG. 11A. Referring again to FIGS. 8A-8E, the SMT waveguide adaptors 44 have alignment pins 52 (FIGS. 8A, 8B, and 10D) that align with alignment holes 58 in the host PCB 12 (as shown in FIG. 7A) that allow precision registration within ±0.003" (±0.08 mm) when mounted to the host PCB 12 as shown in FIGS. 11A-11C, by way of example only. The SMT waveguide adaptors 44 also include threaded holes 64 (FIGS. 8A-8C, 10A, and 10D) that align with the through holes 54 in the host PCB 12 (as shown in FIG. 7A) to allow connection to the corresponding RF shields 48 as described below. The SMT waveguide adaptors 44 also include a set of threaded holes 66 (FIGS. 8B, 8C, 10A, and 10D) for mounting the diplexer 18, as shown in FIG. 12.

Referring now to FIGS. 9A-9E, schematics for an exemplary RF shield 48 are illustrated. FIG. 9E is a cross-sectional view of FIG. 9D along the direction marked 9E in FIG. 9D. In one example, the RF shields 48 are constructed of aluminum with a silver plating, although other materials may be employed. The RF shields 48 are mounted to the surface of the second side 22 of the PCB 12 (as shown in FIGS. 10B and 10C) in the RF shield mounting areas 46 (FIG. 7B) using threaded screws 70 (FIG. 10E), as described below. The RF shields 48 also include holes 68 that align with the through holes 54 in the host PCB 12 (as shown in FIG. 7B) to allow connection to the corresponding SMT waveguide adaptors 44 as shown in FIG. 10E, for example, and as described below.

Figure 10A:
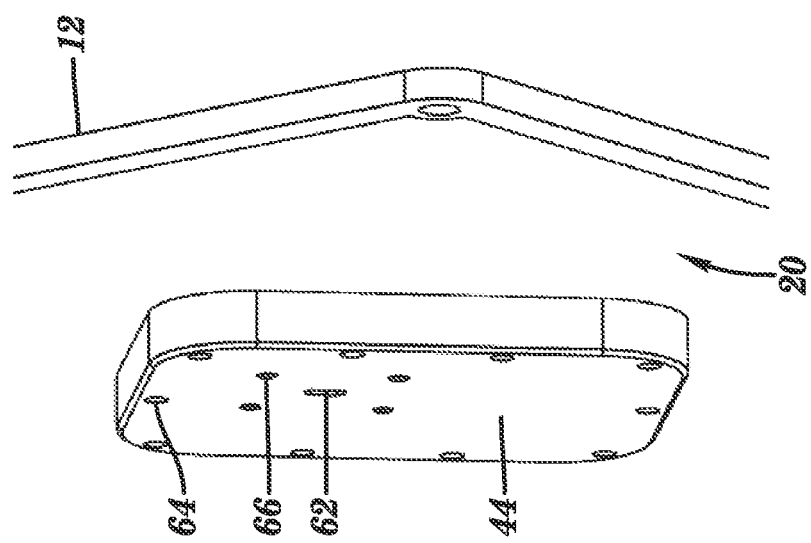
Figure 10F:
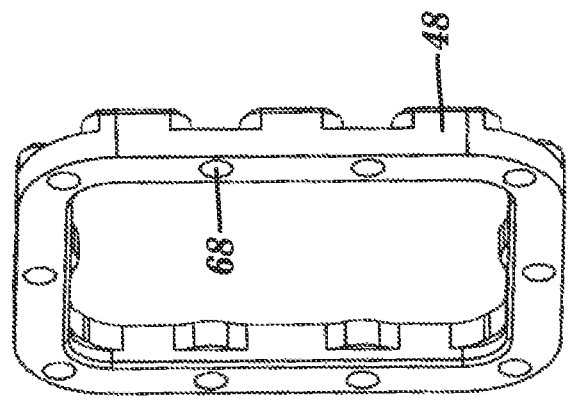
Figure 10E:
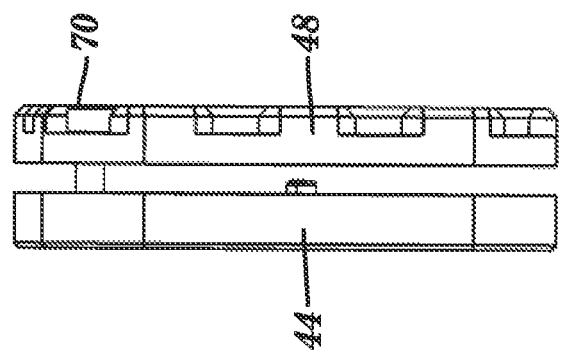
Figure 10D:
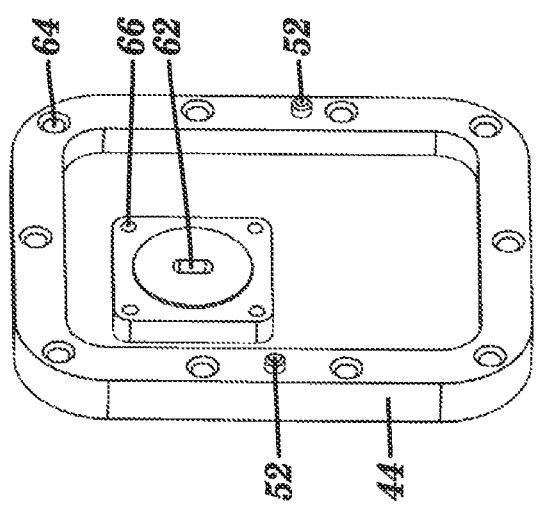
Figure 11B:
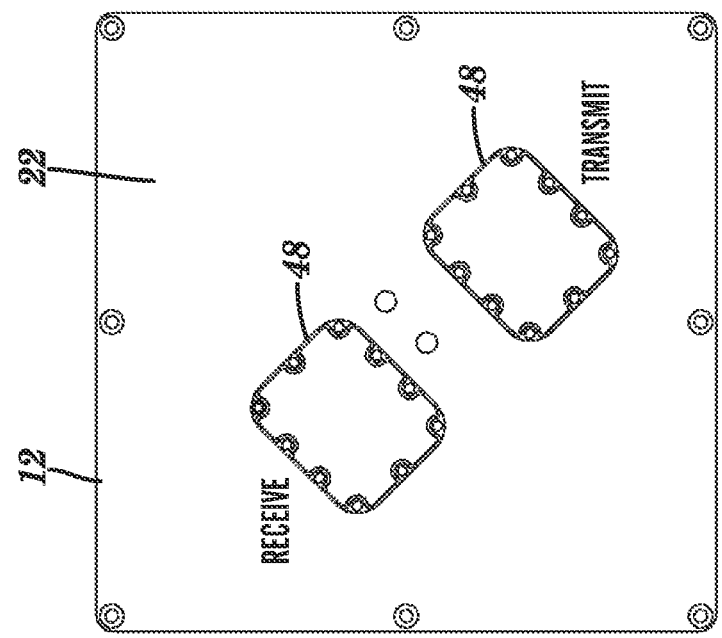
FIG. 11A-11C illustrate an exemplary SMT waveguide adaptor and RF shield mounted to a PCB board.
Figure 11C:
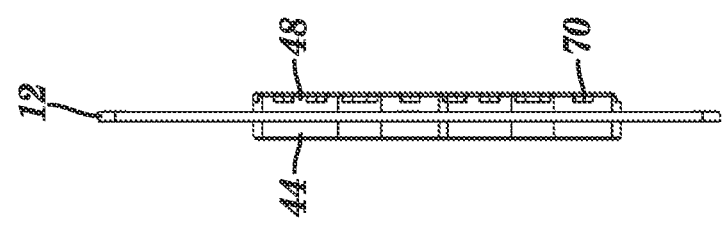
Figure 11A:
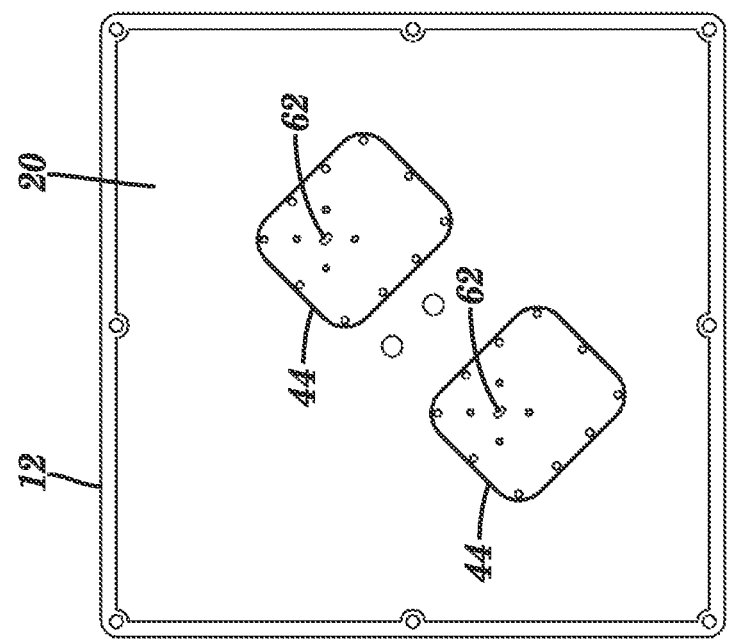

FIGS. 10A-10F illustrates the alignment of the RF shields 48 and the SMT waveguide adaptors 44 when mounted to the second side 22 and the first side 20, respectively, of the host PCB 12 (as shown in FIGS. 10A-10C). Threaded screws 70 (as shown in FIG. 11C) may be used to couple the RF shields 48 and SMT waveguide adaptors 44 through the holes 68 (as shown in FIG. 10F), although other coupling mechanisms may be employed. FIGS. 11A-11C illustrate the RF shields 48 (FIGS. 11B and 11C) and the SMT waveguide adaptors 44 (FIGS. 11A and 11C) when mounted on the second side 22 of the host PCB 12 as shown in FIG. 11B. The RF shields 48 may be located at both transmit and receive locations on the PCB 12.

Figure 12:
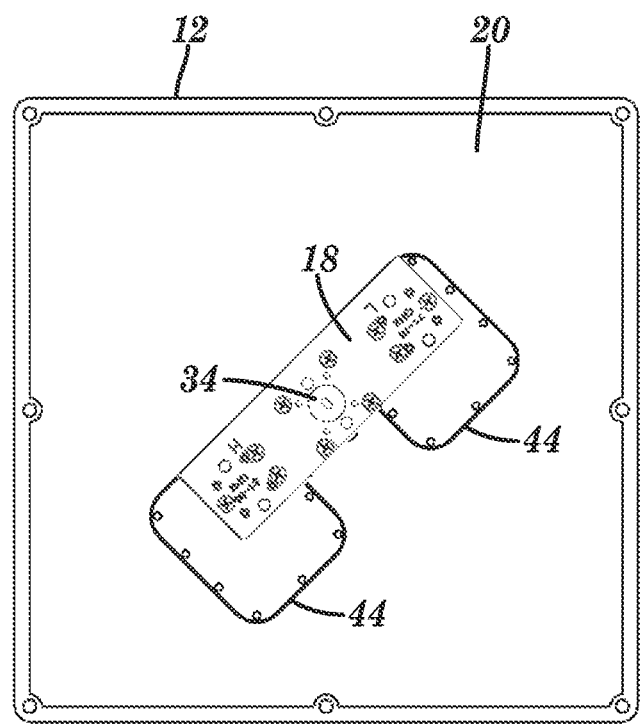
FIG. 12 illustrates an exemplary diplexer mounted to the waveguide adaptors shown in FIG. 11.

FIG. 12 shows the diplexer 18 coupled to the SMT waveguide adaptors 44 located on the first side 20 of the host PCB 12. In this example, the diplexer 18 has the high frequency waveguide port 28 for a high frequency interface, the low frequency waveguide port 26 for a low frequency interface (as shown in FIG. 4B), and the common antenna port 34. The high frequency waveguide port 28 (FIG. 4B) aligns with a mating waveguide pattern on one SMT waveguide adaptor 44, and the low frequency waveguide port 26 (FIG. 4B) aligns with a mating waveguide pattern on the other SMT waveguide adaptor 44. In one example, each of the SMT waveguide adaptors 44 is composed of aluminum with a silver-plated surface to facilitate low electrical loss. These materials also allow for the SMT waveguide adaptors 44 to be soldered in the SMT reflow production process, as described below.

Figure 13A:
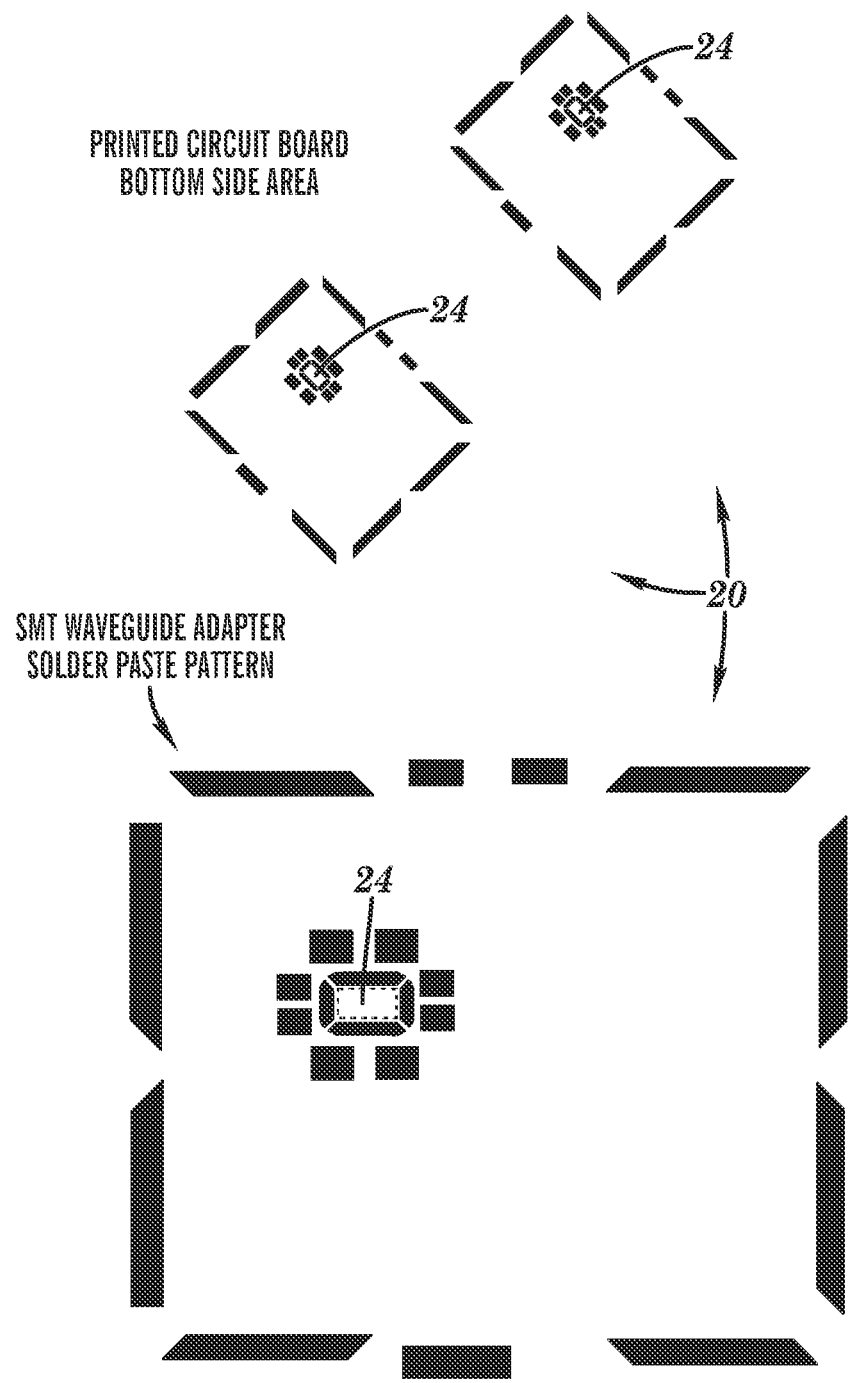
FIG. 13A illustrates an exemplary SMT waveguide adaptor PCB solder paste mask details.

The SMT waveguide adaptors 44 are soldered onto the first side 20 of the PCB 12, as shown in FIG. 12, during the SMT reflow process. Referring now to FIG. 13A, SMT waveguide adapter solder paste patterns are stenciled onto the first side 20 of the PCB 12 (printed circuit board bottom side area) to allow the solder to reflow into the locations required for adhering the SMT waveguide adaptors 44 to ensure electrical and mechanical integrity. The waveguide ports 24 for the SMT waveguide adaptors 44 (FIG. 12) require that the solder surrounds the waveguide ports 24 but does not flow into the waveguide ports 24. This is controlled by the solder paste pattern artwork as part of the PCB design. The outer perimeter solder paste pattern ensures rigid mechanical integrity by allowing the solder to flow around the perimeter footprint of the SMT waveguide adaptors 44 (FIG. 12). The solder paste mask patterns are stenciled onto the first side 20 of the PCB 12 as part of the standard SMT process.

Figure 13B:
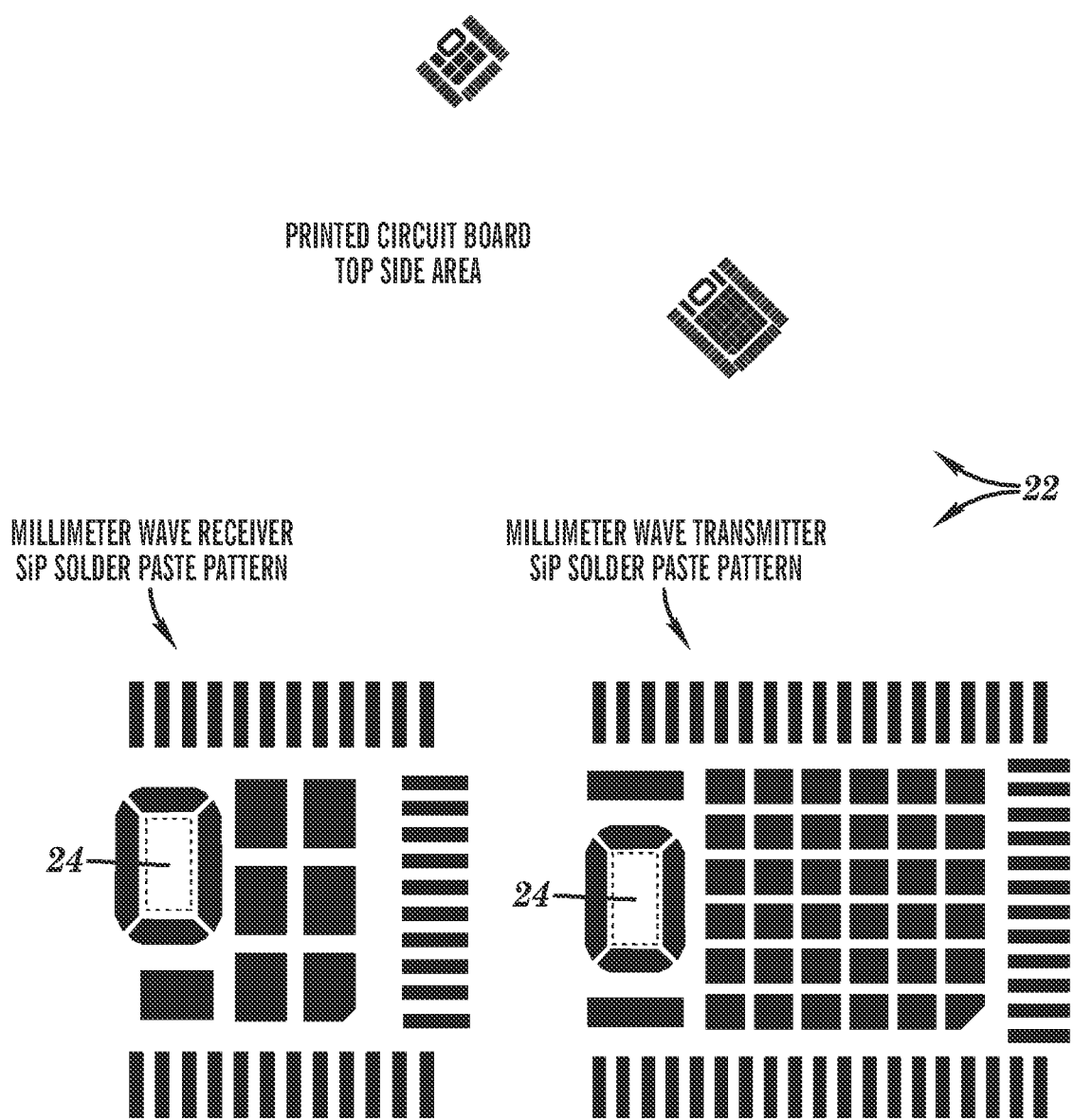
FIG. 13B illustrates exemplary millimeter wave transmitter and receiver side solder paste mask details.

Referring now to FIG. 13B, the waveguide transmitter package 14 and the waveguide receiver package 16, which are SiP SMT packages, as shown in FIG. 7B, are also mounted to the host PCB 12 using the SMT reflow process on the second side 22 of the PCB 12 (printed circuit board top side area) to form a millimeter wave receiver SiP solder paste pattern and a millimeter wave transmitter SiP solder paste pattern. The waveguide port 24 areas for the waveguide transmitter package 14 and the waveguide receiver package 16 (as shown for example in FIG. 7B) require that the solder surrounds the waveguide port 24 openings but does not flow into the openings. This is controlled by the solder paste pattern artwork as part of the PCB design. The solder paste mask patterns for the waveguide transmitter package 14 and the waveguide receiver package 16 (FIG. 7B) are stenciled to the second side 22 of the PCB 12 as part of the standard SMT process.

After the SMT reflow production process, the PCB 12 assembly for the surface mount mmWave transceiver device 10 (FIGS. 2 and 2B) or 100 (FIGS. 3A and 3B) contains all SMT components including the SMT waveguide adaptors 44 mounted to the first side 20 of the PCB 12 (as shown in FIG. 12). The SMT waveguide adaptors 44 (FIG. 12) provide electrical waveguide connectivity and secure mechanical mounting surfaces for the diplexer 18, as shown in FIG. 12. The final assembly steps include mounting the diplexer 18 to the SMT waveguide adaptors 44 with screws (not shown) that thread into the SMT waveguide adaptors 44, which in one example have threaded holes 66 (FIGS. 8B, 8C, 10A, and 10D) that align to the diplexer mounting holes (FIG. 10A). The next assembly steps include mounting the RF shields 48 (FIG. 11B) over the transmitter and receiver SiP device locations on the second side 22 of the PCB 12, using screws that pass through the RF shields 48 and the PCB 12, and thread into the SMT waveguide adaptors 44, which have threaded holes 64 that align to the RF shield mounting holes 68 (as shown in FIGS. 10B and 10C).

A method of making the millimeter wave transceiver device 10 (FIGS. 2A and 2B), which is a fully integrated transceiver device, or the transceiver device 100 (FIGS. 3A and 3B), which is a plug-in module, is also disclosed and is described with respect to FIGS. 2A, 2B, 3A, 3B, 4A, 4B, 5A-5D, and 6A-6D. The method includes providing the printed circuit board (PCB) 12 having waveguide ports 24 located therein. The diplexer 18, such as the diplexer illustrated in FIGS. 4A and 4B having low frequency waveguide port 26 and high frequency waveguide port 28 (FIG. 4B), is surface mounted to the first side 20 of the PCB. The low frequency waveguide port 26 and the high frequency waveguide port 28 of the diplexer 18 are each aligned to a respective one of the waveguide ports 24 of the PCB. In one example, the diplexer 18 is Universal Microwave Technology part number SK80168DX diplexer as illustrated in FIGS. 4A and 4B, although other diplexers may be employed. Each of the low frequency waveguide port 26 and the high frequency waveguide port 28 of the diplexer 18 are coupled to the antenna port 34.

In one example, the diplexer 18 is surface mounted to the PCB 12 in a first orientation such that is configured to be utilized with a low frequency waveguide transmitter package 14 and a high frequency waveguide receiver package 16. In another example, the diplexer 18 is surface mounted to the PCB 12 in a second orientation (rotated 180 degrees from the first orientation) such that it is configured to be utilized with a high frequency waveguide transmitter package 14 and a low frequency waveguide receiver package 16.

Next, the waveguide transmitter package 14 and the waveguide receiver package 16 are surface mounted to the second side 22 of the PCB 12, located opposite the first side 20 of the PCB 12. The transmitter waveguide port 36 and the receiver waveguide port 38 are each aligned to one of the waveguide ports 24 of the PCB 12 when the waveguide transmitter package 14 and the waveguide receiver package 16 are surface mounted. In one example, the waveguide transmitter package 14 is part number ADMV7310 from Analog Devices, Inc., as shown in FIGS. 5A-5D, while the waveguide receiver package 16 is in is part number ADMV7410 from Analog Devices, Inc., as shown in FIGS. 6A-6D, although other transmitters and receivers configured to be surface mounted to the PCB 12 may be used. The waveguide transmitter package 14 and the waveguide receiver package 16 are selected based on the orientation of the diplexer 18 on the PCB.

Although the surface mounting of the diplexer 18, waveguide transmitter package 14, and the waveguide receiver package 16 are described, it is to be understood that various other elements may be surface mounted to the PCB for operation of either the transceiver device 10 (FIGS. 2A and 2B) or the transceiver device 100 (FIGS. 3A and 3B) of this technology. Further, the order of method steps outlined above is not meant to be limiting and the surface mounting can take place with other orders of operation.

Accordingly, this technology provides a number of advantages including providing a surface mount constructed millimeter wave transceiver device and methods of making the same that rely entirely on surface mounting of the waveguide components. This provides a transceiver device that is easy to manufacture, allows for efficient transfer of electromagnetic energy, and efficient coupling between the packages and a diplexer without the need for separate waveguide flanges. Further, the diplexer can be surface mounted in either a high transmit or low transmit configuration without the need for changing the part or the fabrication technique.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A millimeter wave transceiver device comprising:
a printed circuit board having a first waveguide port and a second waveguide port;
a diplexer mounted to a first side of the printed circuit board, the diplexer comprising a low frequency waveguide port and a high frequency waveguide port each coupled to an antenna port;
a transmitter and a receiver directly mounted to a second side of the printed circuit board, located opposite the first side of the printed circuit board, wherein the transmitter and the receiver comprise a transmitter waveguide port and a receiver waveguide port, respectively, that are configured to be aligned to the first waveguide port and the second waveguide port of the printed circuit board, respectively.

2. The device of claim 1, wherein the transmitter waveguide port and the receiver waveguide port are planar with input and power pins for the transmitter and the receiver.

3. The device of claim 1, wherein the diplexer is configured to be mounted to the printed circuit board in either a first orientation with the low frequency waveguide port aligned with the first waveguide port and the high frequency waveguide port aligned with the second waveguide port, or in a second orientation with the low frequency waveguide port aligned with the second waveguide port and the high frequency waveguide port aligned with the first waveguide port.

4. The device of claim 3, wherein the diplexer is mounted to the printed circuit board in the first orientation and wherein the transmitter is a low frequency transmitter and the receiver is a high frequency receiver.

5. The device of claim 3, wherein the diplexer is mounted to the printed circuit board in the second orientation and wherein the transmitter is a high frequency transmitter and the receiver is a low frequency receiver.

6. The device of claim 1 further comprising:
a transmitter oscillator and receiver oscillator surface mounted on the second side of the printed circuit board.

7. The device of claim 1, wherein the diplexer is surface mounted to the printed circuit board.

8. The device of claim 1 further comprising:
waveguide adaptors mounted to the printed circuit board, wherein one of the waveguide adaptors has a waveguide port configured to align to with the first waveguide port and another one of the waveguide adaptors has another waveguide port configured to align with the second waveguide port of the printed circuit board, wherein the diplexer is configured to be coupled to the pair of waveguide adaptors.

9. The device of claim 8, wherein internal surfaces of the first and second waveguide ports of the printed circuit board are plated to form a waveguide electrical connection between the transmitter and receiver and the waveguide adaptors.

10. The device of claim 1 further comprising:
radiofrequency shields configured to be mounted to the printed circuit board, wherein the radiofrequency shields surround a respective outer perimeter of the transmitter and receiver when mounted on the printed circuit board.

11. A method of making a millimeter wave transceiver device, the method comprising:
providing a printed circuit board having a first waveguide port and a second waveguide port;
mounting a diplexer to a first side of the printed circuit board, the diplexer comprising a low frequency waveguide port and a high frequency waveguide port, each of the low frequency waveguide port and the high frequency waveguide port coupled to an antenna port;
directly mounting a transmitter and a receiver to a second side of the printed circuit board, located opposite the first side of the printed circuit board, wherein the transmitter and the receiver comprise a transmitter waveguide port and a receiver waveguide port, respectively, aligned to the first waveguide port and the second waveguide port of the printed circuit board, respectively, when the transmitter and the receiver are mounted.

12. The method of claim 11, wherein the transmitter waveguide port and the receiver waveguide port are planar with input and power pins for the transmitter and the receiver.

13. The device of claim 11, wherein the diplexer is configured to be mounted to the printed circuit board in either a first orientation with the low frequency waveguide port aligned with the first waveguide port and the high frequency waveguide port aligned with the second waveguide port, or in a second orientation with the low frequency waveguide port aligned with the second waveguide port and the high frequency waveguide port aligned with the first waveguide port.

14. The method of claim 13 further comprising:
mounting the diplexer to the printed circuit board in the first orientation, wherein the transmitter is a low frequency transmitter and the receiver is a high frequency receiver.

15. The method of claim 13 further comprising:
mounting the diplexer to the printed circuit board in the second orientation, wherein the transmitter is a high frequency transmitter and the receiver is a low frequency receiver.

16. The method of claim 15 further comprising:
mounting waveguide adaptors to the printed circuit board, wherein one of the waveguide adaptors has a waveguide port configured to align to with the first waveguide port and another one of the waveguide adaptors has another waveguide port configured to align with the second waveguide port of the printed circuit board; and coupling the diplexer to the waveguide adaptors.

17. The method of claim 11, wherein the diplexer is surface mounted to the printed circuit board.

18. The method of claim 11 further comprising:
mounting a transmitter oscillator and receiver oscillator on the second side of the printed circuit board.

19. The method of claim 11 further comprising:
plating internal surfaces of the first and second waveguide ports of the printed circuit board to form a waveguide electrical connection between the transmitter and receiver and the waveguide adaptors.

20. The method of claim 11 further comprising:
mounting radiofrequency shields to the printed circuit board, wherein the radiofrequency shields surround an outer perimeter of the transmitter and receiver when mounted on the printed circuit board.

\* \* \* \* \*